United States Patent [19]

Feightner et al.

[11] Patent Number: 5,748,446
[45] Date of Patent: May 5, 1998

[54] HEAT SINK SUPPORT

[75] Inventors: Rick Feightner, West Linn; My-Hanh Nguyen, Portland, both of Oreg.

[73] Assignee: Intel Corporation, Santa Clara, Calif.

[21] Appl. No.: 764,609

[22] Filed: Dec. 11, 1996

[51] Int. Cl.$^6$ ........................................ H05H 7/20
[52] U.S. Cl. .................. 361/709; 361/690; 165/185; 257/718
[58] Field of Search .................. 165/80.3, 185; 174/16.3; 257/718–719, 721–722, 726, 727; 361/690, 704, 707, 709–711, 719–720, 737, 760, 807, 809–810, 825

[56] References Cited

U.S. PATENT DOCUMENTS

| | | | |
|---|---|---|---|
| 4,441,140 | 4/1984 | Richard | 361/720 |
| 5,051,866 | 9/1991 | Osaka | 361/711 |
| 5,586,005 | 12/1996 | Cipulla | 257/719 |
| 5,612,852 | 3/1997 | Leverault et al. | 361/709 |

*Primary Examiner*—Gregory D. Thompson
*Attorney, Agent, or Firm*—Blakely, Sokoloff, Taylor & Zafman

[57] ABSTRACT

A heat sink support device including a base and a top member is provided to support a finned heat sink attached to a processor card assembly of a computer system. The base member includes a number of dowels disposed on a bottom surface for securing the base member to a motherboard. The base member also includes a number of necked pins disposed on a top surface, and the top member includes a number of cutouts disposed on an edge for mating with the necked pins, to render a set of the fins captive, to prevent the heat sink from moving beyond the tolerance allowed between the fins and the base and top members.

14 Claims, 5 Drawing Sheets

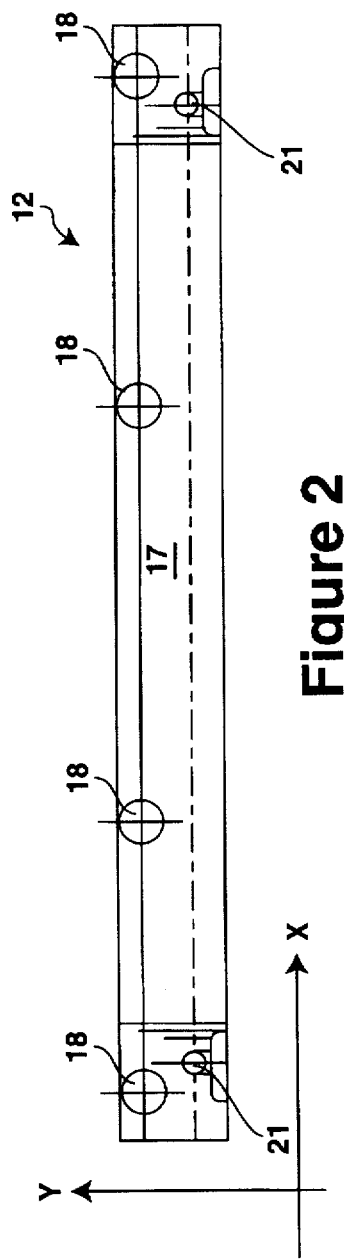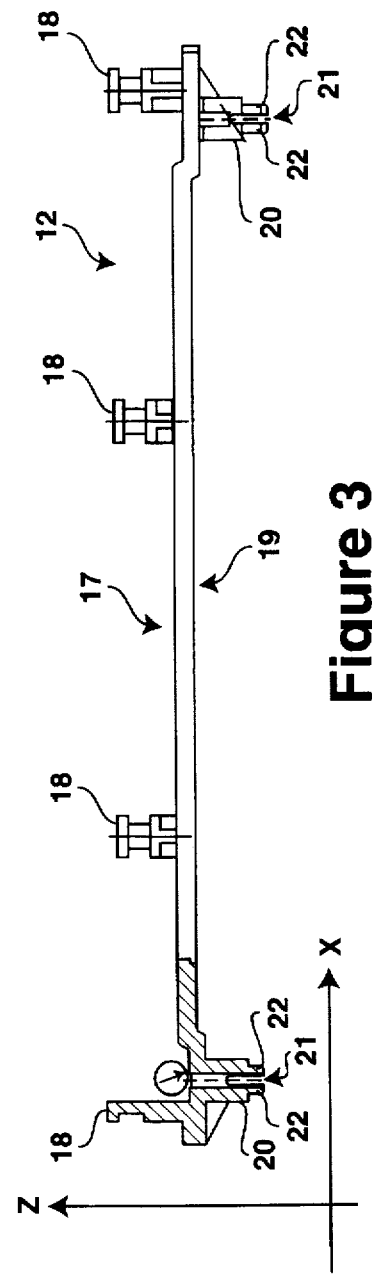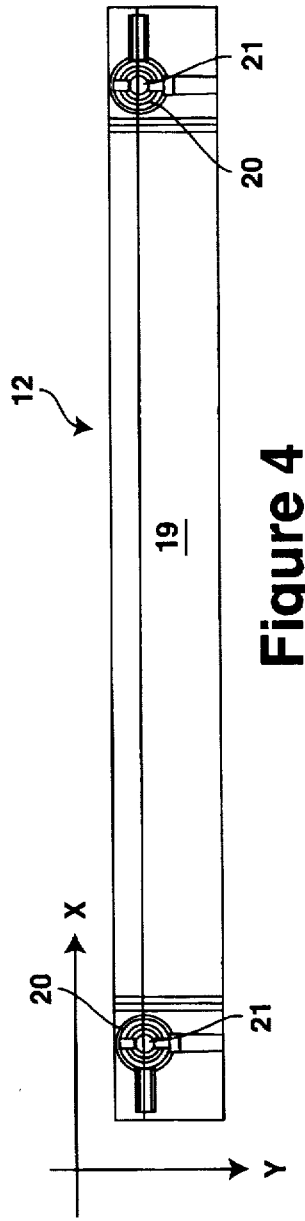

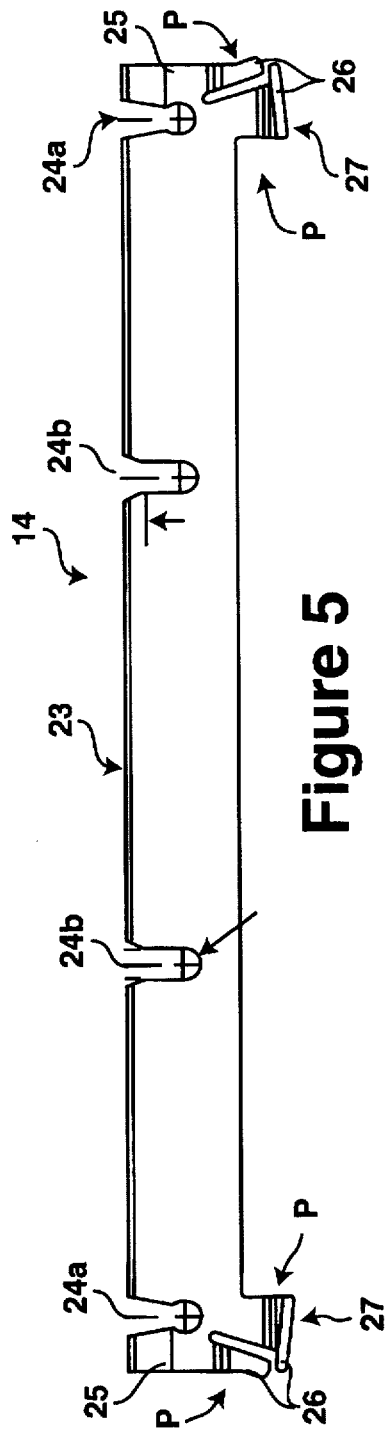
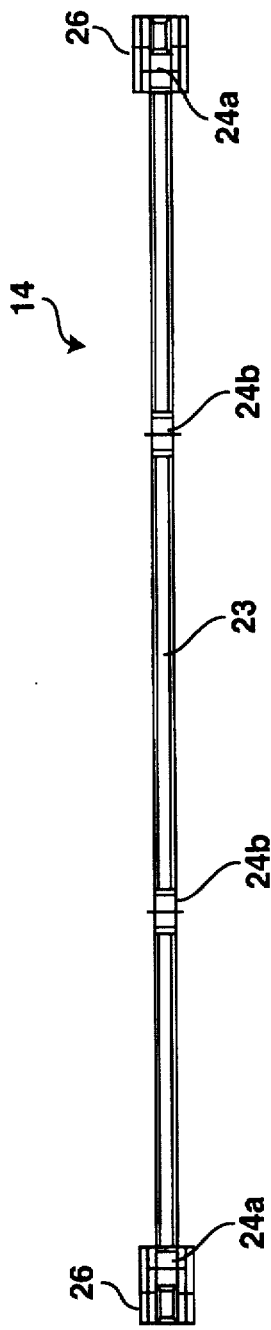
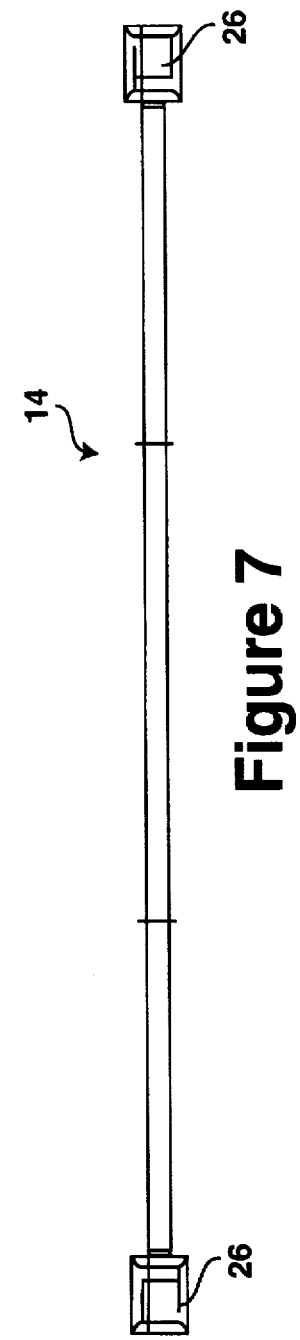

HEAT SINK SUPPORT

BACKGROUND OF THE INVENTION

1. Field of the Invention

The present invention relates to the field of computer systems. More specifically, the present invention relates to the structural support for heat sinks of microprocessors in microprocessor based computer systems.

2. Background Information

In recent years, microprocessor technology has continued to advance in increasingly more rapid pace. During this period, microprocessor operating speed has increased from 60 MHz to over 200 Mhz. This trend is expected to continue. As a result, increasing amount of heat has to be removed from these advanced microprocessors, leading to the employment of heat sinks with ever increasing form factors.

Some of these advanced microprocessors are expected to be packaged employing what is known in the art as single edge technology. That is, the microprocessors are mounted onto single edge processor cards. These single edge processor cards with mounted microprocessors are then in turn inserted into single edge connectors disposed on the motherboards. The large form factor heat sinks are attached to the microprocessors orthogonal to the processor cards. Due to the heavy weight of these heat sinks, vibrations and shocks experienced by the systems, for example during shipment, could inflict severe damages to the motherboards as well as to the processor cards, including but not limited to warping of the motherboards.

Thus, a new heat sink support device suitable for supporting these large form factor heavy heat sinks, and the single edge packaging technology is needed.

SUMMARY OF THE INVENTION

In view of the above described desire, a heat sink support device including a base and a top member is provided to support a finned heat sink attached to a processor card assembly of a computer system. The base member includes a number of dowels disposed on a bottom surface for securing the base member to a motherboard. The base member also includes a number of necked pins disposed on a top surface, and the top member includes a number of cutouts disposed on an edge for mating with the necked pins, to render a number of the heat sink fins captive, thereby preventing movement by the heat sink beyond the tolerance allowed between the fins and the base and top members.

In one embodiment, each dowel of the base member includes a hollowed center accessible through the top surface of the base member, and a number of deflectable fingers, and the heat sink support device further includes a number of pins for correspondingly mating the with hollowed center to counter any inward force exerted on the deflectable fingers.

In one embodiment, the cutouts of the top member includes a cutout at each end of the top member, and each of these cutouts at the respective ends includes a deflectable arm and a push pad for facilitating mating of these cutouts at the respective ends with the corresponding ones of the necked pins of the base member.

BRIEF DESCRIPTION OF DRAWINGS

The present invention will be described by way of exemplary embodiments, but not limitations, illustrated in the accompanying drawings in which like references denote similar elements, and in which:

FIGS. 2–4 illustrate a top, a front, and a bottom view of the base member of the heat sink support device;

FIGS. 5–7 illustrate a top, a front, and a back view of the top member of the heat sink support device;

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Figure 1:
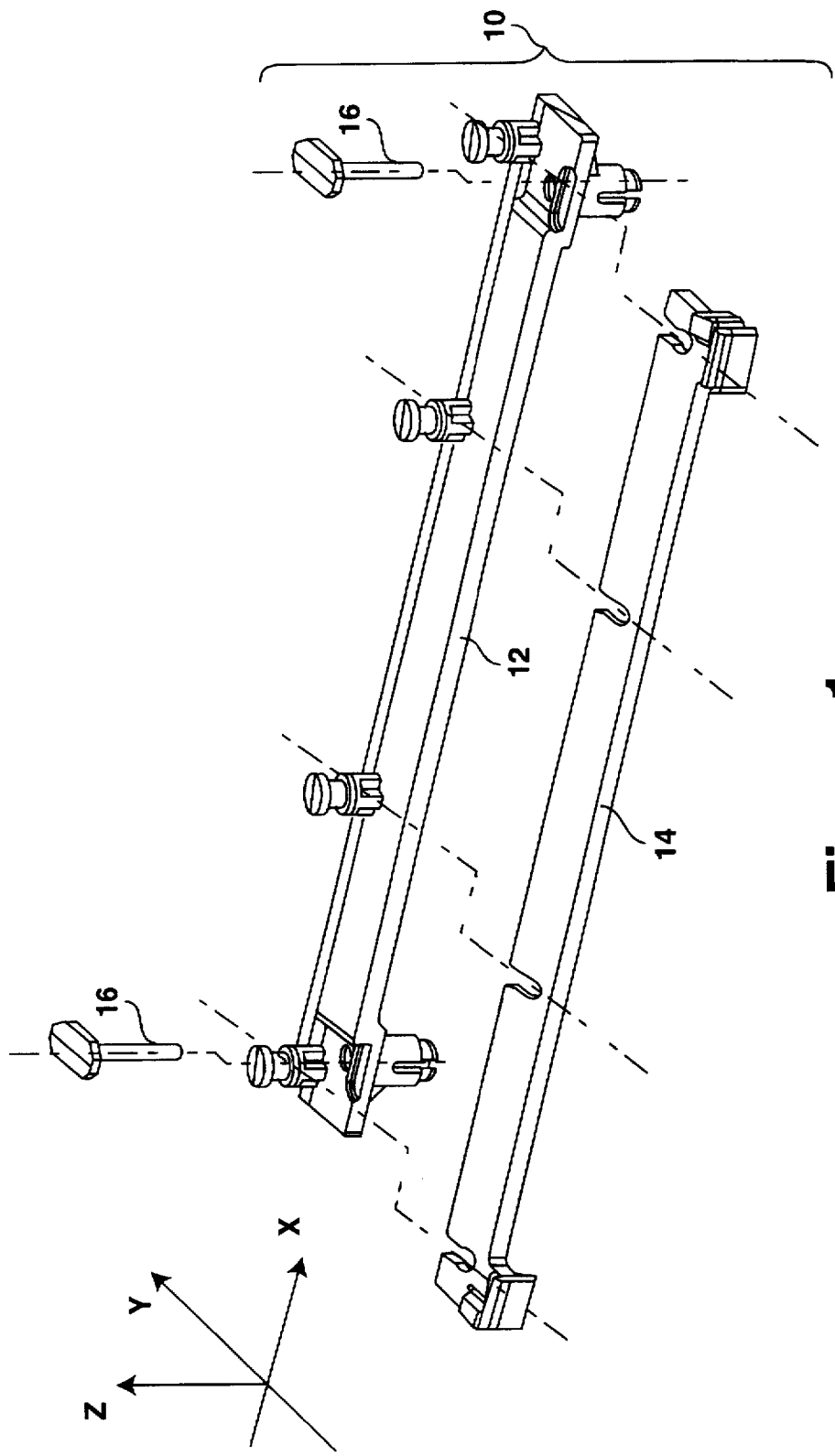
FIG. 1 illustrates an exploded perspective view of the heat sink support device of the present invention.

Referring now to FIG. 1, wherein one embodiment of the heat sink support device of the present invention is shown. As illustrated, heat sink support device 10 of the present invention includes base member 12 and top member 14. For the illustrated embodiment, heat sink support device 10 further includes pins 16. As will be described in more detail below, base and top members 12 and 14 cooperate to support a large form factor heavy heat sink, preventing the large form factor heat sink from inflicting damages to the motherboard (50 of FIG. 11) and/or a processor card (inside 40 of FIG. 11), as a result of vibrations and shocks. In one embodiment, base and top members 12 and 14 are made of injection molded thermoplastic.

Referring now also to FIGS. 2–4, wherein a top view, a front view, and a bottom view of base member 12 are shown. As illustrated, base member 12 include dowels 20 disposed on bottom surface 19, and necked pins 18 disposed on top surface 17. Dowels 20 are used to secure base member 12 to the motherboard by way of pre-drilled holes of complementary sizes disposed on the motherboard. Usage of necked pins 18 will be described in more details below.

For the illustrated embodiment, each dowel 20 includes a number of deflectable fingers 22. Each dowel 20 further includes a hollowed center 21, accessible through top surface 17. Deflectable fingers 22 snugly mate with the pre-drilled holes of complementary sizes of the motherboard, thereby allowing base member 12 to be snapped in place and securely attached to the motherboard. In other words, deflectable fingers 22 are being pushed inward by the pre-drilled holes of complementary sizes of the motherboard. Pins 16 (FIG. 1) mate correspondingly with hollowed centers 21 to counter the inward force exerted on deflectable fingers 22, thereby keeping them snugly mated with the pre-drilled holes of the motherboard.

Referring now also to FIGS. 5–7, wherein a top view, a front view, and a back view of top member 14 are shown. As illustrated, top member 14 includes cutouts 24a and 24b disposed on edge 23. Cutouts 24a and 24b mate with necked pins 18 of base member 12 to secure and support a large form factor heavy heat sink. Cutouts 24a and 24b, and the neck portions of necked pins 18 are complementary sized.

For the illustrated embodiment, cutouts 24a disposed at the respective ends of top member 14 are smaller than cutouts 24b disposed at the center portion of top member 14, to allow a tighter fit with necked pins 18 disposed at the corresponding ends of bottom member 12. Each of cutouts 24a includes a deflectable arm 25, and top member 14 further includes handles 26 and push pads 27 disposed at the respective ends as shown. Deflectable arms 25 facilitate mating of cutouts 24a with corresponding necked pins 18. Handles 26 facilitate "opening" of cutouts 24a, when handles 26 are squeezed in the P—P direction, while push pads 27 facilitate mating of cutouts 24a by providing the pads to exert force against corresponding necked pins 18.

Figure 8:
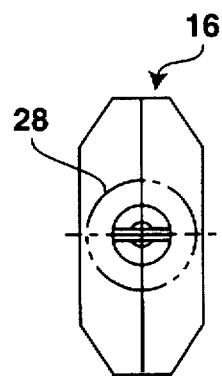
FIGS. 8–10 illustrate a bottom, a side, and a front view of the pins of the heat sink support device.
Figure 9:
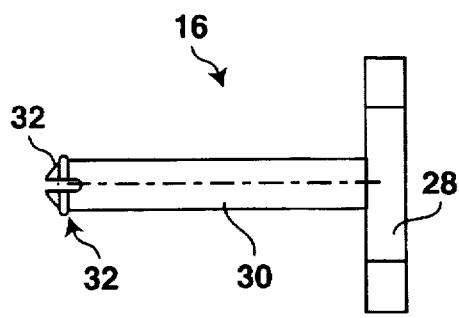
Figure 10:
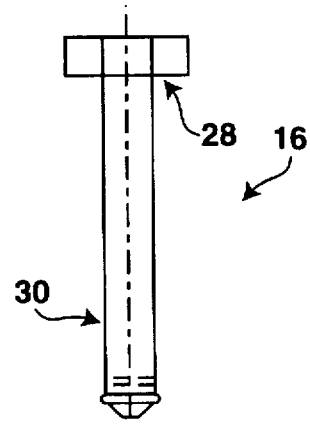

FIGS. 8–10 illustrate pins 16 in further detail. For the illustrated embodiment, each pin 16 includes head 28 and stem 30. Stem 30 includes fingers 32 disposed at its tip for facilitate mating with a hollowed center 21 of bottom member 12, and countering inward force exerted on deflectable fingers 22 of dowels 20.

Figure 11:
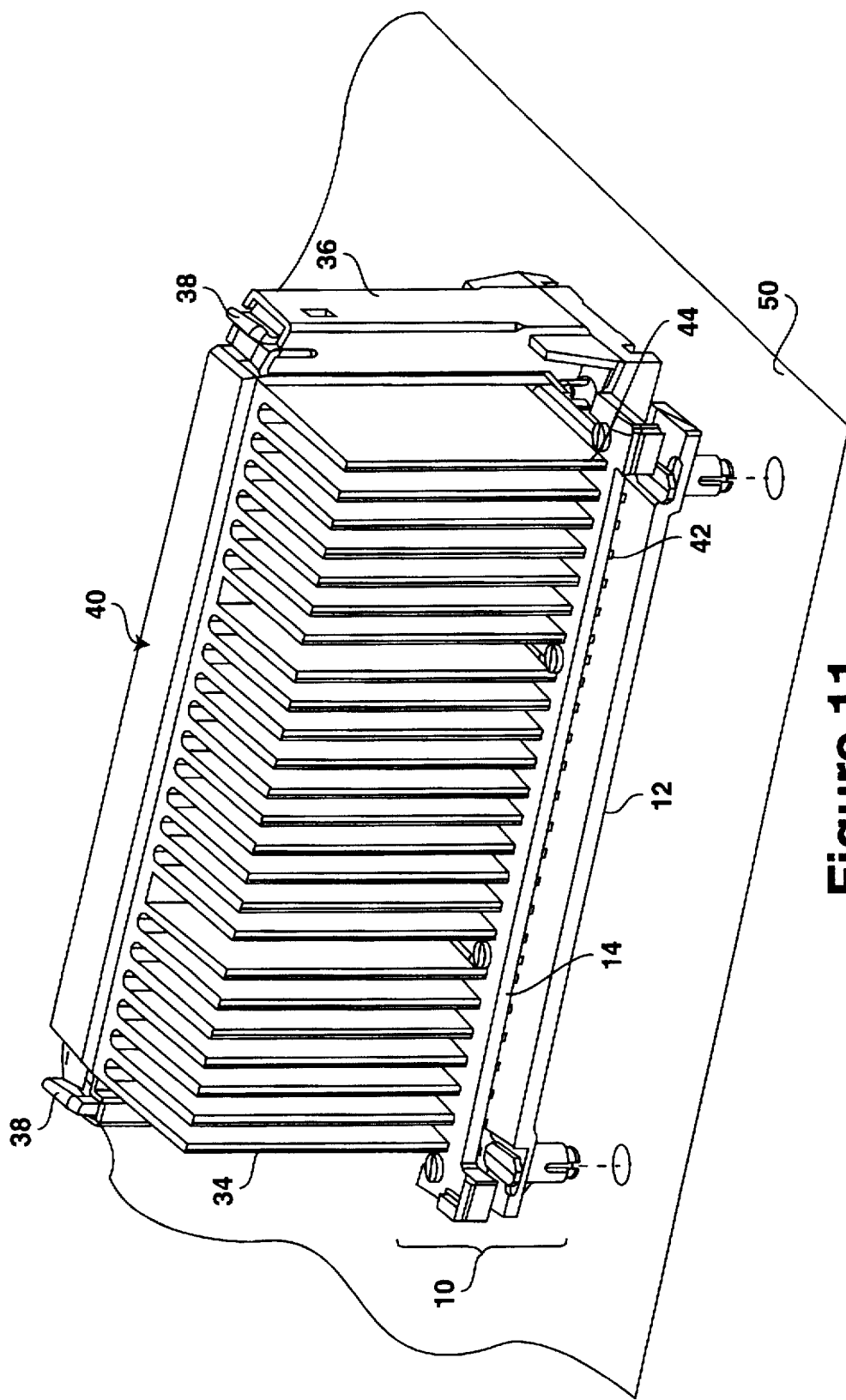
FIG. 11 illustrates the present invention supporting a heat sink mounted to a processor card assembly.

FIG. 11 illustrated heat sink support device 10 of the present invention supporting one embodiment of a large form factor heavy heat sink 34. Heat sink 34 is attached to a thermal plate (hidden behind heat sink 34) of processor card assembly 40. Processor card assembly 40 is latched to retention system 36 by way of flexable locking mechanism 38. Processor card assembly 40 includes a single edge processor card having a microprocessor mounted thereon. The single edge processor card is in turn inserted into a single edge connector disposed on the motherboard 50. The single edge processor card (therefore the microprocessor), as well as the single edge connector are hidden by heat sink 34 and processor card assembly 40. Processor card assembly 40 is intended to represent a broad category of microprocessor packaging, against which a large form factor heavy heat sink is attached. The illustrated processor card assembly 40 is described in detail in U.S. patent application Ser. No. 08/739,815, entitled Processor Card Assembly, which is hereby fully incorporated by reference. Similarly, retention system 36 is intended to represent a broad category of retention mechanism. The illustrated retention system 36 is described in detail in U.S. patent application Ser. No. 08/741,023, entitled Retention Apparatus For Processor Card Assembly, which is hereby also fully incorporated by reference.

As shown, bottom and top members 12 and 14 are engaged as described above, rendering the subset fins 42 of heat sink 34 captive, thereby preventing movement of heat sink 34 beyond the tolerance, i.e., the small gaps, allowed between fins 42 and bottom and top members 12 and 14.

While the heat sink support device of the present invention has been described in terms of the above illustrated embodiment, those skilled in the art will recognize that the invention is not limited to the embodiment described. The present invention can be practiced with modification and alteration within the spirit and scope of the appended claims. Accordingly, the description is to be regarded as illustrative instead of restrictive on the present invention.

Thus, a heat sink support device has been described. What is claimed is:

1. A heat sink support apparatus comprising:
   a base member having a plurality of dowels disposed on a bottom surface of the base member for securing the base member to a circuit board, the base member further having a plurality of necked pins disposed on a top surface of the base member;
   a top member having a plurality of cutouts disposed on a first edge of the top member for mating with the necked pins to render a plurality of fins of a heat sink captive, to prevent movement by the heat sink beyond a predetermined amount of tolerance allowed between the fins and the base and top members.

2. The apparatus as set forth in claim 1, wherein
   each dowel of the base member comprises a plurality of deflectable fingers, and a hollowed center that is accessible through the top surface of the base member; and
   the apparatus further comprises a plurality of pins for correspondingly mating with the hollowed centers of the dowels to counter inward force exerted on the deflectable fingers.

3. The apparatus as set forth in claim 1, wherein the plurality of cutouts of the top member includes a first and a second cutout disposed at a first and a second end of the top member respectively, and each of the first and second cutouts include a deflectable sidearm for facilitating mating of the first and second cutouts with a first and a second of the necked pins of the base member.

4. The apparatus as set forth in claim 3, wherein the top member further includes a first and a second pair of handles disposed at the first and second ends respectively to facilitate opening of the deflectable arm of each of the first and second cutouts.

5. The apparatus as set forth in claim 3, wherein the top member further includes a first and a second push pad disposed at the first and second ends respectively to facilitate exerting force on the first and second necked pins of the base member, when mating the first and second cutouts of the top member with the first and second necked pins of the base member.

6. The apparatus as set forth in claim 1, wherein at least one of the base or the top member is made of injection molded thermoplastic.

7. A computer system comprising:
   a) a motherboard;
   b) a processor card assembly attached to the motherboard;
   c) a heat sink attached to a front surface of the processor card assembly, and the heat sink having a plurality of fins; and
   d) a heat sink support device having a first and a second support member that cooperates to render a subset of the plurality of fins captive between the first and the second support members, to prevent movement of the heat sink beyond a predetermined amount of tolerance allowed between the captive fins and the first and the second support members.

8. The computer system as set forth in claim 7, wherein the first member of the heat sink support device includes a plurality of dowels disposed on a bottom surface of the first member for securing the first member to the motherboard.

9. The computer system as set forth in claim 7, wherein the first member includes a plurality of necked pins disposed on a top surface of the first member; and
   the second member includes a plurality of cutouts disposed on a first edge of the second member for mating with the necked pins of the first member to render the subset of the plurality of fins captive.

10. The computer system as set forth in claim 8, wherein
    each dowel of the first member comprises a plurality of deflectable fingers, and a hollowed center that is accessible through the top surface of the first member; and
    the heat sink support device further comprises a plurality of pins for correspondingly mating with the hollowed centers of the dowels to counter inward force exerted on the deflectable fingers.

11. The computer system as set forth in claim 9, wherein the plurality of cutouts of the second member of the heat sink support device includes a first and a second cutout disposed at a first and a second end of the second member respectively, and each of the first and second cutouts include a deflectable sidearm for facilitating mating of the first and second cutouts with a first and a second of the necked pins of the first member of the heat sink support device.

12. The computer system as set forth in claim 11, wherein the second member further includes a first and a second pair of handles disposed at the first and second ends respectively to facilitate opening of the deflectable arm of each of the first and second cutouts.

13. The computer system as set forth in claim 11, wherein the second member further includes a first and a second push pad disposed at the first and second ends respectively to facilitate exerting force on the first and second necked pins of the first member, when mating the first and second cutouts of the second member with the first and second necked pins of the first member.

14. The computer system as set forth in claim 7, wherein at least one of the first or the second member is made of injection molded thermoplastic.

* * * * *